(12) United States Patent
Iwai et al.

(10) Patent No.: US 10,991,443 B2
(45) Date of Patent: Apr. 27, 2021

(54) MEMORY APPARATUS AND DATA READ METHOD

(71) Applicant: TOSHIBA MEMORY CORPORATION, Minato-ku (JP)

(72) Inventors: Katsuhiko Iwai, Yokohama (JP); Shinji Maeda, Kawasaki (JP); Takaaki Ikeda, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/542,650

(22) Filed: Aug. 16, 2019

(65) Prior Publication Data

US 2020/0286576 A1 Sep. 10, 2020

(30) Foreign Application Priority Data

Mar. 5, 2019 (JP) .............................. JP2019-039972

(51) Int. Cl.
*G11C 29/42* (2006.01)
*G06F 11/10* (2006.01)
(Continued)

(52) U.S. Cl.
CPC ............ *G11C 29/42* (2013.01); *G06F 11/008* (2013.01); *G06F 11/0793* (2013.01); *G06F 11/102* (2013.01); *G06F 11/1044* (2013.01); *G06F 3/0656* (2013.01); *G06F 3/0688* (2013.01); *G06F 11/076* (2013.01);
(Continued)

(58) Field of Classification Search
CPC .. G06F 3/0656; G06F 3/0688; G06F 12/0868; G06F 11/0766; G06F 11/0787; G06F 11/076; G06F 2212/7203; G06F 2212/1032; G06F 11/1044; G06F 11/02;
(Continued)

(56) References Cited

U.S. PATENT DOCUMENTS 8,312,348 B2 11/2012 Yamaga
9,158,621 B2 10/2015 Sharon et al.
(Continued)

FOREIGN PATENT DOCUMENTS

JP 2008-198234 A 8/2008
JP 4672743 B2 4/2011
TW 201711172 A 3/2017

*Primary Examiner* — April Y Blair
*Assistant Examiner* — Sazzad Hossain
(74) *Attorney, Agent, or Firm* — Oblon, McClelland, Maier & Neustadt, L.L.P.

(57) ABSTRACT

A memory apparatus of an embodiment includes a nonvolatile semiconductor memory device, an error correction circuit, a memory circuit, a data distribution circuit, and a processing circuit. The error correction circuit performs error detection in data read from the nonvolatile semiconductor memory device on a processing unit size basis and performs error correction on the data in response to its necessity. The memory circuit stores data on the processing unit size basis. The data distribution circuit transfers the data read from the nonvolatile semiconductor memory device to the error detection circuit and the memory circuit on the processing unit size basis. The processing circuit reads the data from the memory circuit and processes the data in response to the error correction circuit detecting an uncorrectable error in the data.

11 Claims, 8 Drawing Sheets

(51) Int. Cl.
  *G06F 11/00*   (2006.01)
  *G06F 11/07*   (2006.01)
  *G06F 3/06*   (2006.01)
  *G06F 12/0868*   (2016.01)
  *G11C 29/52*   (2006.01)

(52) U.S. Cl.
  CPC ...... *G06F 11/0766* (2013.01); *G06F 11/0787* (2013.01); *G06F 12/0868* (2013.01); *G06F 2212/1032* (2013.01); *G06F 2212/7203* (2013.01); *G11C 29/52* (2013.01)

(58) Field of Classification Search
  CPC .... G06F 11/0793; G06F 11/008; G11C 29/52; G11C 29/42
  See application file for complete search history.

(56) References Cited

U.S. PATENT DOCUMENTS

| | | | |
|---|---|---|---|
| 10,170,202 B2 | 1/2019 | Iwai et al. | |
| 2012/0239996 A1* | 9/2012 | Higeta | G06F 11/1048 714/746 |
| 2019/0250843 A1* | 8/2019 | Ratnam | G11C 29/52 |
| 2020/0110708 A1* | 4/2020 | Ma | G06F 12/0246 |

\* cited by examiner

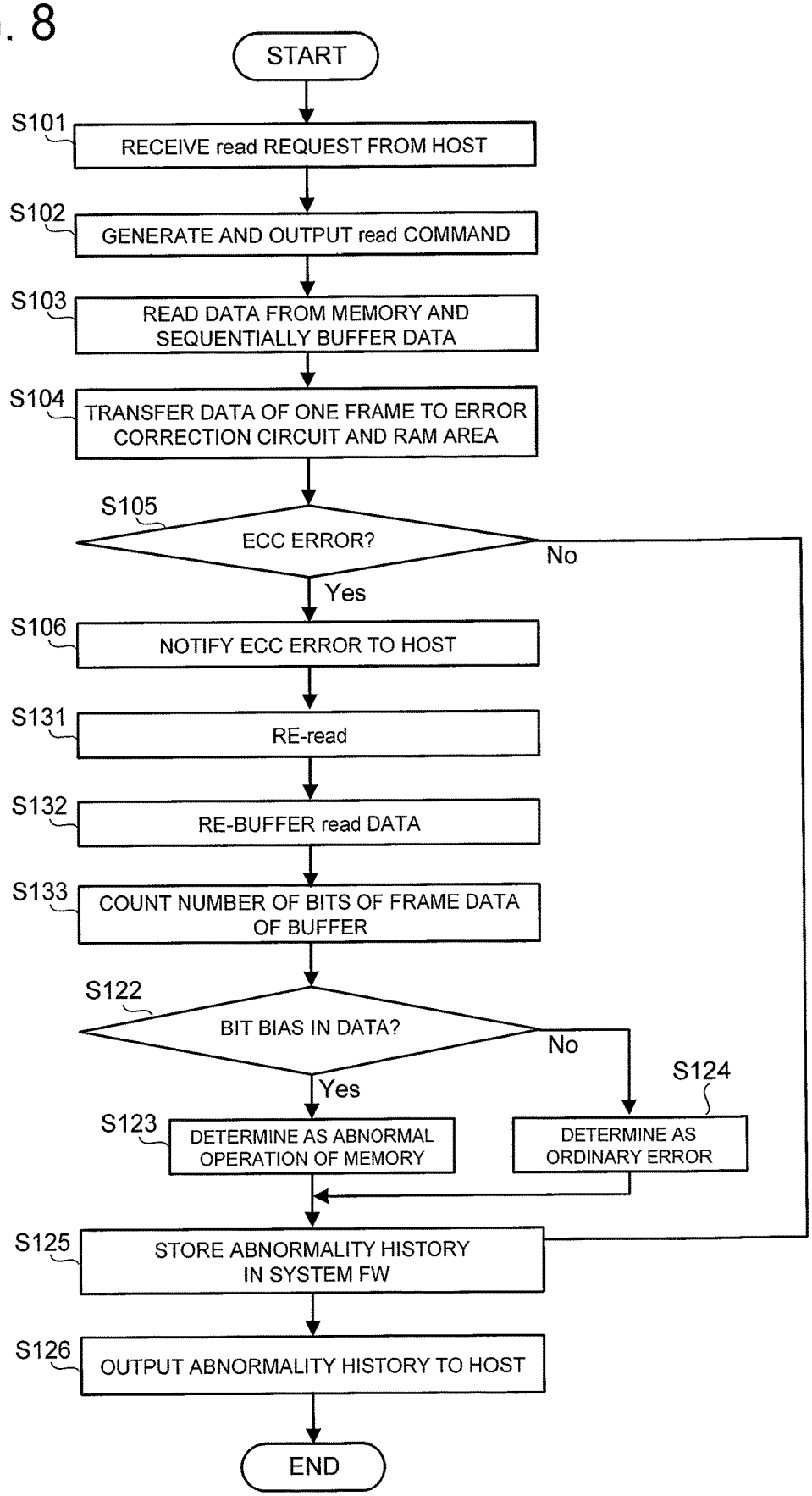

MEMORY APPARATUS AND DATA READ METHOD

CROSS-REFERENCE TO RELATED APPLICATIONS

This application is based upon and claims the benefit of priority from Japanese Patent Application No. 2019-039972, filed on Mar. 5, 2019; the entire contents of which are incorporated herein by reference.

FIELD

Embodiments relate to a memory apparatus including a nonvolatile semiconductor memory device such as SSD (Solid State Drive), eMMC (embedded Multi Media Card), and UFS (Universal Flash Storage), and to a data read method.

BACKGROUND

A memory apparatus (memory module) mounts a nonvolatile semiconductor memory device such as a NAND flash memory, and reads data (read data) from the semiconductor memory device in response to a read command from a host device. This read data may contain a bit error.

To cope with such a bit error, a conventional memory module has an error correction circuit in its controller to correct the error in the read data, but the error correction has a limitation. Specifically, if the read data contains a certain amount of errors (degradation) or more, the memory module returns a response of an uncorrectable (ECC error) to the host device.

The ECC error of the read data can be caused not only by the degradation of data but also by hardware of the NAND flash memory. Specifically, the hardware can cause a data output abnormality, that is, an uncorrectable bit error (ECC error).

In the case of this data output abnormality, data with, for example, all "0's" or all "1's" is output even though already written data area is being read. This is also notified as the ECC error from the controller to the host device, leading to an increase in analysis cost at the time of system evaluation of the controller. That is, it takes time to discriminate whether the data output abnormality from the semiconductor memory device is caused by the degradation of the read data or by a hardware factor of the semiconductor memory device.

BRIEF DESCRIPTION OF THE DRAWINGS

FIG. 8 is a flowchart illustrating an example of the operation of the memory system of the fourth embodiment.

DETAILED DESCRIPTION

A memory apparatus of an embodiment includes a nonvolatile semiconductor memory device, an error correction circuit, a memory circuit, a data distribution circuit, and a processing circuit. The error correction circuit performs error detection in data read from the nonvolatile semiconductor memory device on a processing unit size basis and performs error correction on the data in response to its necessity. The memory circuit stores data on the processing unit size basis. The data distribution circuit transfers the data read from the nonvolatile semiconductor memory device to the error detection circuit and the memory circuit on the processing unit size basis. The processing circuit reads the data from the memory circuit and processes the data in response to the error correction circuit detecting an uncorrectable error in the data.

Embodiments will be hereinafter described in detail with reference to the drawings.

First Embodiment

Figure 1:
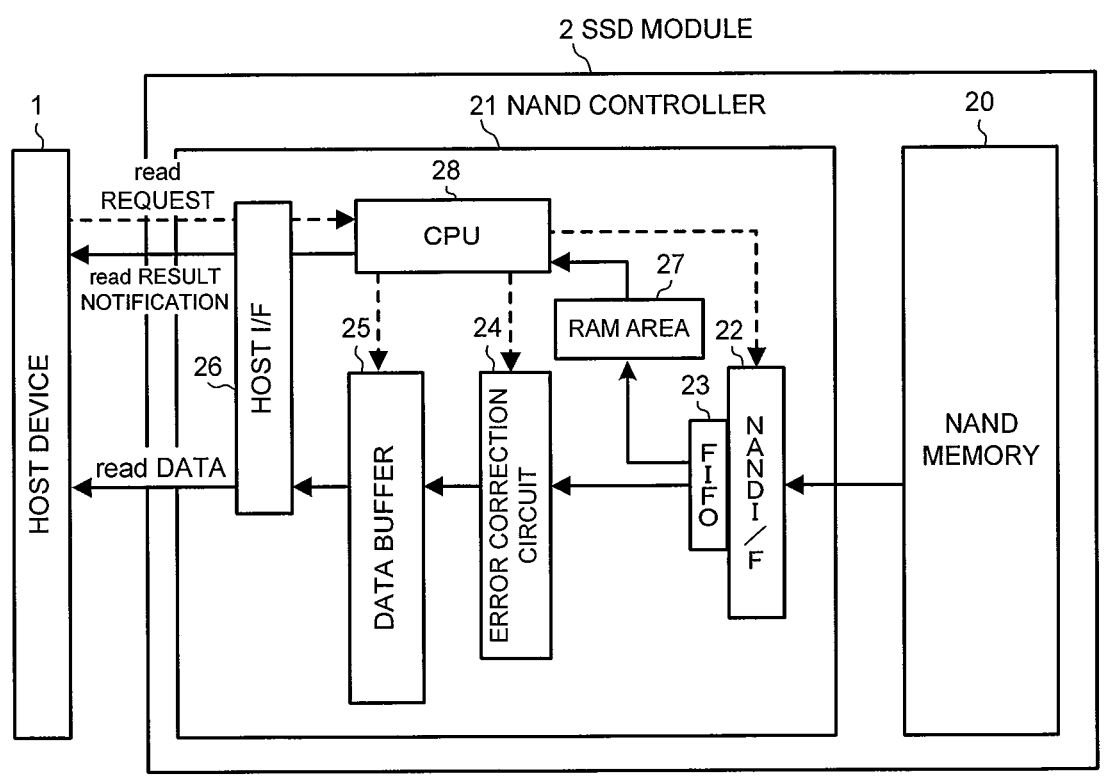
FIG. 1 is a diagram illustrating an example of the configuration of a memory system of a first embodiment.

FIG. 1 is a diagram illustrating the configuration of a memory system of a first embodiment. Note that, in FIG. 1, the solid lines are lines indicating the flow of data (data lines) and the broken lines are lines for sending control signals such as requests and commands (control lines). The same applies to other FIG. 3, FIG. 5, and FIG. 7.

As illustrated in FIG. 1, the memory system of the first embodiment includes a host device 1 and an SSD module 2 which is a memory device. The SSD module 2 includes a NAND flash memory 20 (hereinafter, referred to as a "NAND memory 20") which is a nonvolatile semiconductor memory device and a NAND controller 21. The SSD module 2 reads data from the NAND memory 20 having data stored therein.

The NAND memory 20 has a plurality of memory blocks classified by address block. At the time of data write, an address is designated, whereby data can be written to a memory block corresponding to the address. At the time of data read, an address is designated, whereby data can be read from a memory block corresponding to the address.

The NAND controller 21 includes a NAND interface 22 (hereinafter, referred to as a "NANDI/F 22"), a FIFO buffer memory 23 (hereinafter, referred to as a "FIFO 23"), an error correction circuit 24, a data buffer 25, a host interface 26 (hereinafter, referred to as a "host I/F 26"), a Random Access Memory area 27 (hereinafter, referred to as a "RAM area 27") which is a storing circuit or a memory area, and a CPU 28 which is a control circuit.

The NAND controller 21 reads/writes from/to the NAND memory 20. The NANDI/F 22 performs interface processing for the NAND memory 20.

When reading data (at the time of data read), the FIFO 23 reads the data from the NAND memory 20 byte by byte and holds the data in sequence. When data of a predetermined processing unit size (for example, 4 kbytes corresponding to one frame or 16 kbytes corresponding to four frames, which is an error correction size) is accumulated, the FIFO 23 outputs the data of this unit size to the error correction circuit 24 and the RAM area 27. When finishing the output of the data of the processing unit size, the FIFO 23 starts overwriting with data of a subsequent frame. The processing unit size is not limited to one frame, four frames, or the like and may be a different number of frames.

That is, the NANDI/F 22 and the FIFO 23 are data distribution circuits, and not only transfer the data of the processing unit size read from the NAND memory 20 to the error correction circuit 24 but also save the data in the RAM area 27.

The error correction circuit 24 has an error correction coding unit and an error correction decoding unit. The error correction coding unit generates an error correction code regarding data to be written to the NAND memory 20 and appends it to the data. The error correction decoding unit performs error detection in data which has been read from the NAND memory 20 on a predetermined processing unit size basis (on a frame-by-frame basis), and performs error correction as required.

In more detail, at the time of data read, the error correction decoding unit captures data of one frame output from the FIFO 23 and performs the error detection and the error correction. The error correction decoding unit writes, to the data buffer 25, data where no error is detected or data having undergone the error correction. The data buffer 25 temporarily holds the data. The held data is read by, for example, the host device 1 at a predetermined timing.

The host I/F 26 performs interface processing for the host device 1. In the interface processing, it outputs data held in the data buffer 25 to the host device 1 according to an instruction from the CPU 28. Besides, at the time of data write, the host I/F 26 holds data received from the host device 1 in the data buffer 25 according to an instruction from the CPU 28. A detailed description of the write operation will be omitted.

The RAM area 27 is a memory area of a memory for temporarily holding data, and is capable of storing data (latest data not having undergone the error correction (ECC) decoding) of the predetermined processing unit size (for example, one frame) output from the FIFO 23.

If the data decoding result of the error correction circuit 24 turns out to be normal, data of the next frame is overwritten to the RAM area 27. Further, if the data decoding result turns out to be abnormal, data held in the RAM area is read by the CPU 28. After the data is read, the RAM area 27 is overwritten with the next data. The RAM area 27 temporarily holds data of the error correction size until the error correction circuit 24 gets the data decoding result.

The CPU 28 reads/writes data from/to the NAND memory 20 by controlling the aforesaid circuits and elements, according to a request from the host device 1. If the error correction circuit 24 detects an uncorrectable error in data, the CPU 28 functions as a processing circuit to read the data saved in the RAM area 27 and perform predetermined processing involved in data analysis.

For example, if the error correction circuit 24 detects an ECC error, the CPU 28 notifies the ECC error to the host device 1. Thereafter, the CPU 28 reads, from the RAM area 27, the data written to the FIFO 23 to process it. This read is substantially in the same timing as the write of the data where the ECC error is detected by the error correction circuit 24.

In other words, the CPU 28 sends data at the same address on the NAND memory 20 both to the RAM area 27 and the error correction circuit 24. Thereafter, when the error correction circuit 24 detects the ECC error in the data sent to the error correction circuit 24 side, the CPU 28 performs necessary processing using the data sent to the RAM area 27 side. For example, the CPU 28 outputs the data held in the RAM area 27 to the host device 1 (external device) according to a data output request from the host device 1.

Next, the operation (data read method) of the memory system of the first embodiment will be described with reference to the flowchart in FIG. 2.

Figure 2:
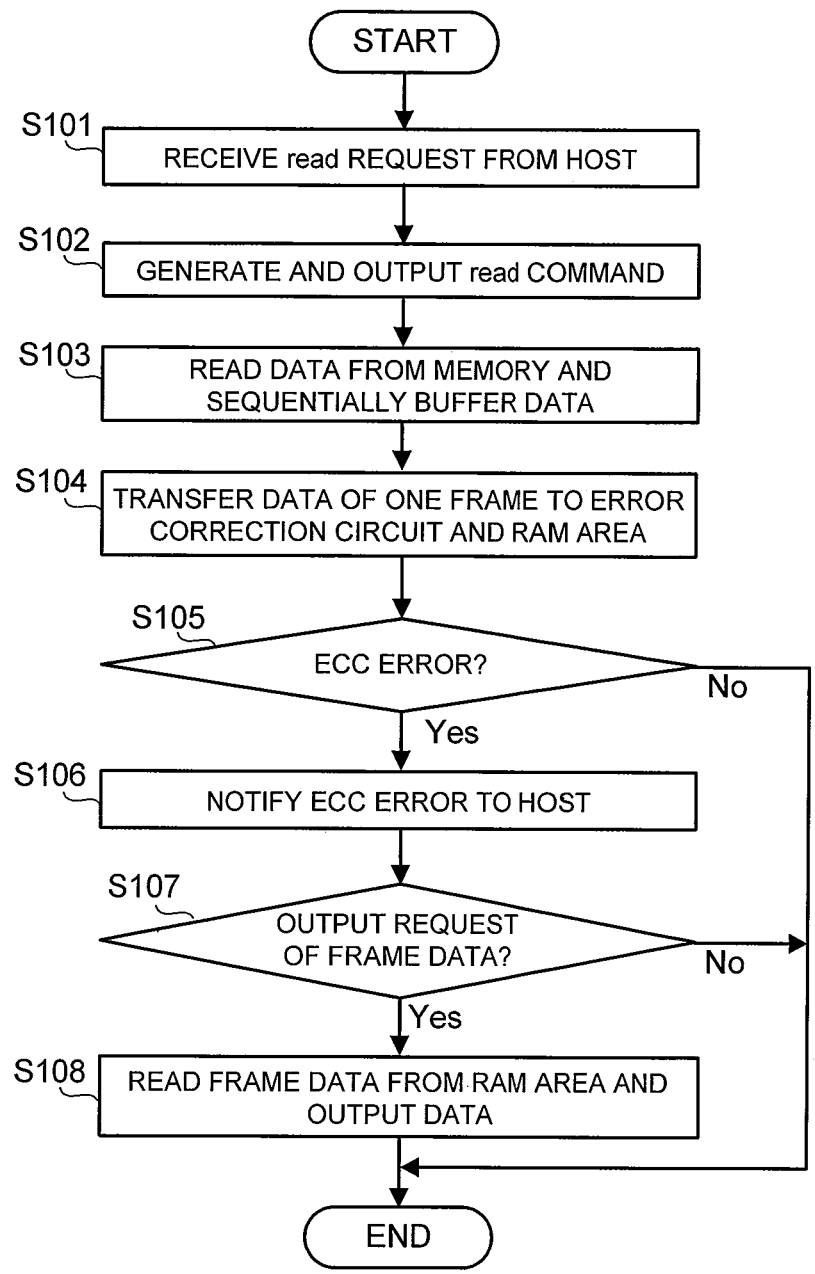
FIG. 2 is a flowchart illustrating an example of the operation of the memory system of the first embodiment.

In this memory system, at the time of the read of data stored in the NAND memory 20, a data read request (this will be referred to as a "read request") is issued from the host device 1, and this request is received by the SSD module 2 (S101 in FIG. 2).

In the SSD module 2, the CPU 28 generates a read command based on the received read request and outputs it to the NANDI/F 22 (Step S102).

At this time, the CPU 28 analyzes an access address to the NAND memory 20 based on the read request, sets an issue command (read command) and the access address in a CMD queue of the NANDI/F 22, and outputs the read command.

When the NAND memory 20 is busy, the CPU 28 outputs the read command after waiting until the NAND memory 20 is released from the busy state.

Upon receiving the read command, the NANDI/F 22 reads the data from the designated access address of the NAND memory 20 byte by byte and buffers the data in the FIFO 23 in sequence (Step S103).

When a volume of the sequentially accumulated data reaches the predetermined processing unit size (for example, one frame), the FIFO 23 transfers the data to the error correction circuit 24 and the RAM area 27 (Step S104).

The error correction circuit 24 performs the error detection in the transferred data. When detecting an error in the data, the error correction circuit 24 corrects the error. When normally finishing the error correction, the error correction circuit 24 stores the error-corrected data in the data buffer 25. Data where no error is detected is stored in the data buffer 25 as it is.

If the error correction of the data in which the error is detected fails, the error correction circuit 24 notifies this to the CPU 28. Upon receiving the notification to the effect that the error correction has failed from the error correction circuit 24, the CPU 28 determines that there is an ECC error (Step S105). The CPU 28 outputs the determination result "ECC error" as a read result to the host device 1 (Step S106).

When receiving an output request of the frame data having the "ECC error" from the host device 1 (Yes at Step S107) after notifying the read result to the host device 1, the CPU 28 reads, from the RAM area 27, the frame data whose output is requested and outputs it to the host device 1 (Step S108).

The host device 1 analyzes the data of one frame sent from the SSD module 2 and determines whether or not the read data itself is abnormal. In a case where the read data has a bit bias (the read data is all "0's", all "1's", or other bit array close to either of these), the host device 1 determines that an abnormal operation is occurring in the NAND memory 20, and otherwise, determines the error as ordinary data degradation.

As described above, the memory system of the first embodiment has the RAM area 27 which holds (saves) read data itself read from the NAND memory 20 and sent to the error correction circuit 24. The RAM area 27 holds data of one frame (error correction target size). If the decoding result of the read data in the error correction circuit 24 turns out to be an ECC error, the read data saved in the RAM area 27 (the same data as the read data where the ECC error has occurred) is output to the host device 1 according to a request from the host device 1. This enables the host device 1 side to analyze the error data at an early stage. That is, an output abnormality of data read from the NAND memory 20 can be detected and identified at an early stage, enabling a reduction in analysis cost.

Second Embodiment

Figure 3:
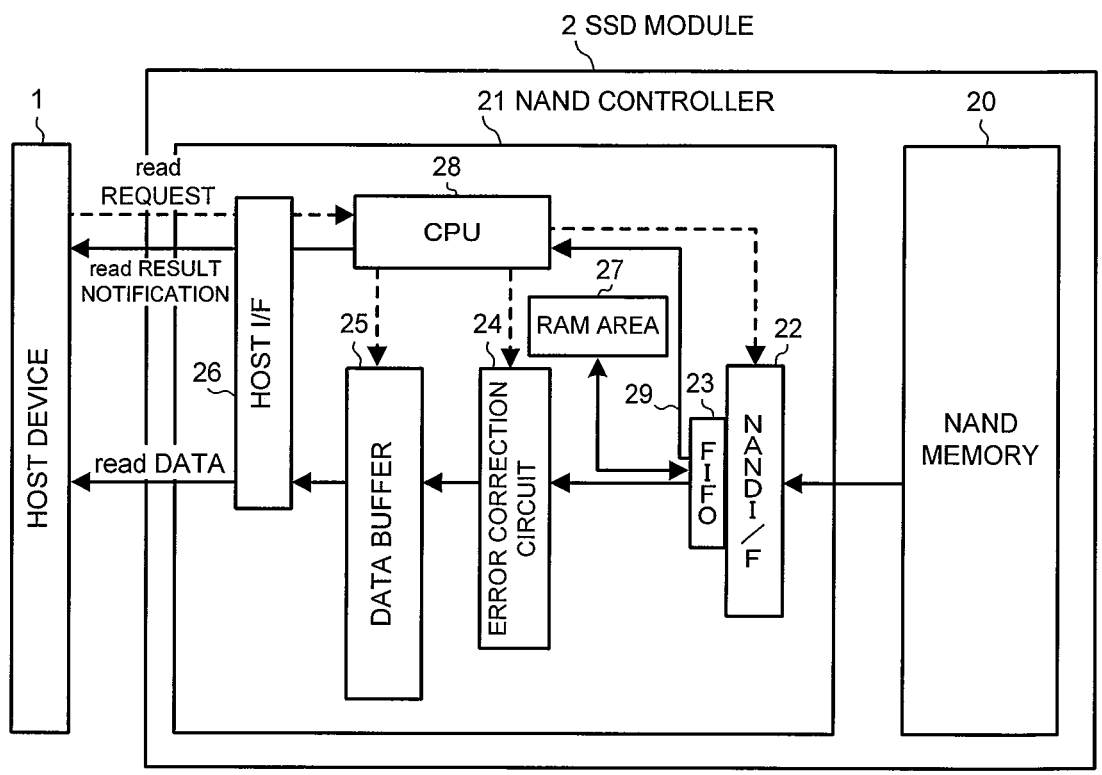
FIG. 3 is a diagram illustrating an example of the configuration of a memory system of a second embodiment.

FIG. 3 is a diagram illustrating the configuration of a memory system of a second embodiment. In the description of the second embodiment, the same structures as those of the first embodiment will be denoted by the same reference signs, and a description thereof will be omitted.

As illustrated in FIG. 3, the memory system of the second embodiment includes a data line 29 from the FIFO 23 to the CPU 28. The data line 29 enables the CPU 28 to directly read data from a predetermined area of the NAND memory 20. Upon receiving a request from the host device 1 after notifying an ECC error to the host device 1, the CPU 28 reads data from the NAND memory 20 and transmits it to the host device 1 not through the error correction circuit 24.

In the second embodiment, when the error correction circuit 24 detects an ECC error in read data as a result of decoding the read data, the CPU 28 re-programs (re-stores) the read data held in the RAM area 27 (read data not having undergone the decoding by the error correction circuit 24), in a memory area (hereinafter, this will be referred to as a "predetermined area"), on the NAND memory 20, whose address is different from that of a normal data memory area. That is, read live data is held in the NAND memory 20, and the read live data is read from the NAND memory 20 when required.

Figure 4:
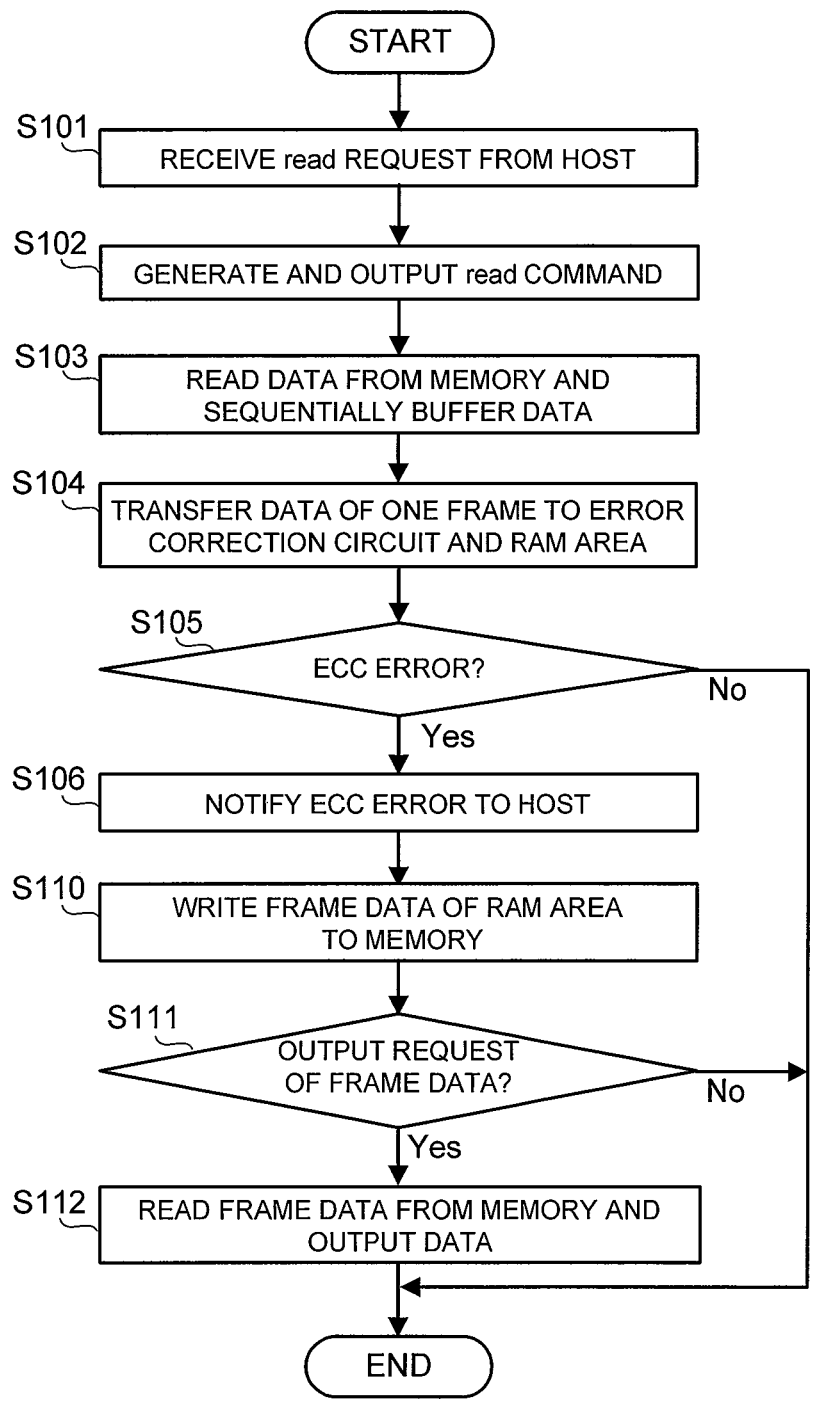
FIG. 4 is a flowchart illustrating an example of the operation of the memory system of the second embodiment.

Hereinafter, the operation of the memory system of the second embodiment will be described with reference to the flowchart in FIG. 4. In the description of the operation of the second embodiment, the same steps as those of the first embodiment will be denoted by the same reference signs and a description thereof will be omitted.

In this memory system, when the SSD module 2 receives a read request from the host device 1, the CPU 28 issues a read command. As a result, data in the NAND memory 20 is buffered sequentially in the FIFO 23, and data of one frame is accumulated in the FIFO 23. Thereafter, the data is transferred to the error correction circuit 24 and the RAM area 27 (Steps S101 to S104 in FIG. 4).

When the data decoding by the error correction circuit 24 results in the detection of an ECC error (Yes at Step S105), the CPU 28 notifies the host device 1 that the ECC error has been detected, as a read result (Step S106).

The CPU 28 programs the data of a frame unit size (hereafter, referred to as "frame data") saved in the RAM area 27 and writes the data in a predetermined area of the NAND memory 20 (Step S110). "Program" here means to convert the frame data into data of a write unit size of the NAND memory 20 (data of a one-page unit size).

Upon receiving an output request of the frame data having the "ECC error" from the host device 1 (Yes at Step S111) after notifying the read result to the host device 1, the CPU 28 reads the frame data (re-read data) whose output is requested, from the predetermined area of the NAND memory 20. The CPU 28 receives this data through the data line 29 and outputs it to the host device 1 without the error correction being performed (Step S112).

The host device 1 analyzes the read data of one frame sent from the SSD module 2 to determine whether or not the data itself is abnormal. If the read data has a bit bias (if the read data is all "0's", all "1's", or other bit array close to either of these), it is determined that an abnormal operation is occurring in the NAND memory 20, and otherwise, it is determined that the error is ordinary data degradation. The presence/absence of the bit bias can be determined based on a preset threshold value (bit bias condition). The presence/absence of the bit bias may be determined based on an AND condition of the counted numbers of bits and the bit array, or may be determined based only one of these.

As described above, the memory system of the second embodiment brings about the same effect as that of the above-described first embodiment by storing read data in the RAM area 27. In addition, read data where an ECC error is detected is saved in the NAND memory 20 from the RAM area 27. This makes it possible for the data where the error has occurred to be nonvolatile and be retained without being restricted by memory capacity, making it possible to analyze the contents of the data output abnormality from many data.

That is, in the second embodiment as well, it is possible to detect an output abnormality of data read from the NAND memory 20 at an early stage and determine whether the abnormality of the read data is hardware abnormality or data abnormality, enabling a reduction in analysis cost.

Third Embodiment

Figure 5:
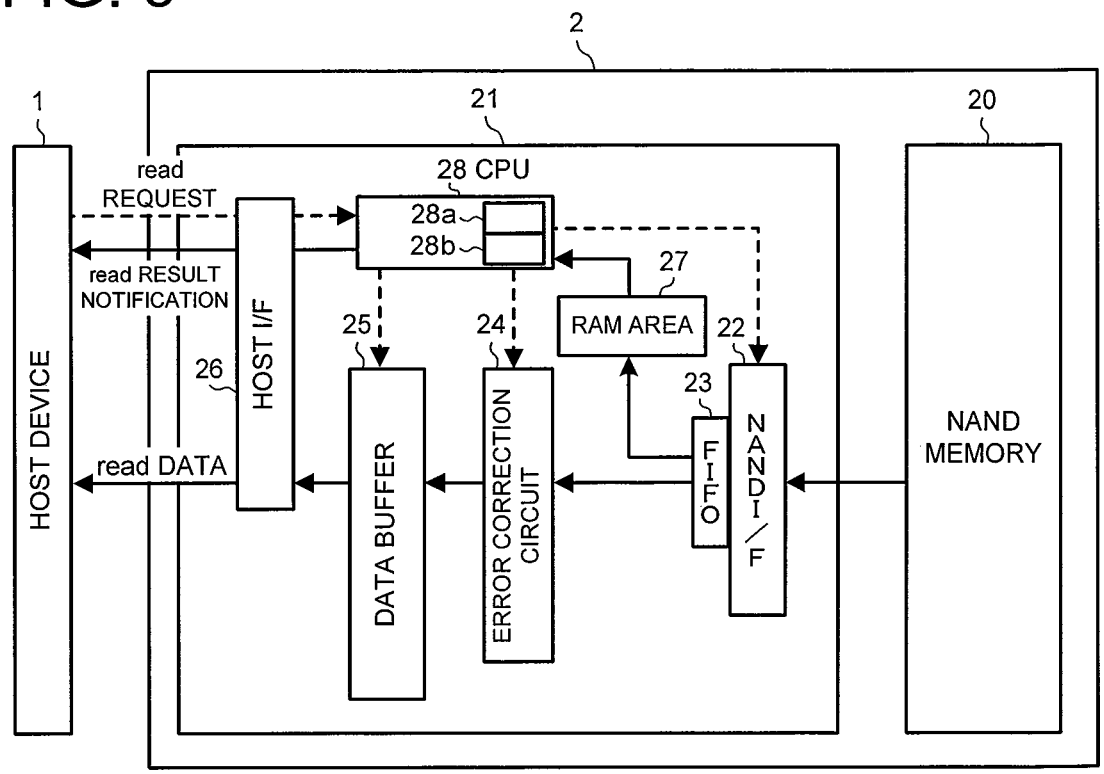
FIG. 5 is a diagram illustrating an example of the configuration of a memory system of a third embodiment.

FIG. 5 is a diagram illustrating the configuration of a memory system of a third embodiment. As illustrated in FIG. 5, in the memory system of the third embodiment, the CPU 28 includes a bit count circuit 28a and an abnormality determination circuit 28b.

The bit count circuit 28a performs the bit count of data of one frame held in the RAM area 27, thereby counting the number of "0" or "1" in the data. That is, the bit count circuit 28a counts the number of bits of data saved in the RAM area 27.

The abnormality determination circuit 28b compares the result of the bit count by the bit count circuit 28a (the number of "0" or "1" in the data) with a preset bit bias condition (threshold value) to determine if there is an abnormality. That is, the abnormality determination circuit 28b determines that the NAND memory 20 has an abnormal operation or there is data degradation at the time of read, according to whether the bit count result satisfies the bit bias condition (is equal to or more than the threshold value) or not (is less than the threshold value). The abnormality determination circuit 28b notifies the determination result as a read result to the host device 1. The abnormality determination circuit 28b appends a flag corresponding to the determination result to the read data and stores it as an abnormality history in a predetermined memory area in the memory module 2, for example, a memory area of system firmware (hereinafter, referred to as "system FW") or the like (management of the abnormality history).

The flag corresponding to the determination result is, for example, "1" indicating the abnormality of the NAND memory 20 and "0" indicating the data degradation, or vice versa. The determination on the presence/absence of the bit bias is performed based on the comparison with the threshold value (bit bias condition) (based on the determination on whether or not the condition is satisfied) as in the second embodiment.

That is, when the value counted by the bit count circuit 28a and/or a bit array satisfies the preset bias condition, the abnormality determination circuit 28b determines that the NAND memory 20 has an operation abnormality, and otherwise, determines that there is data degradation at the time of the read.

Figure 6:
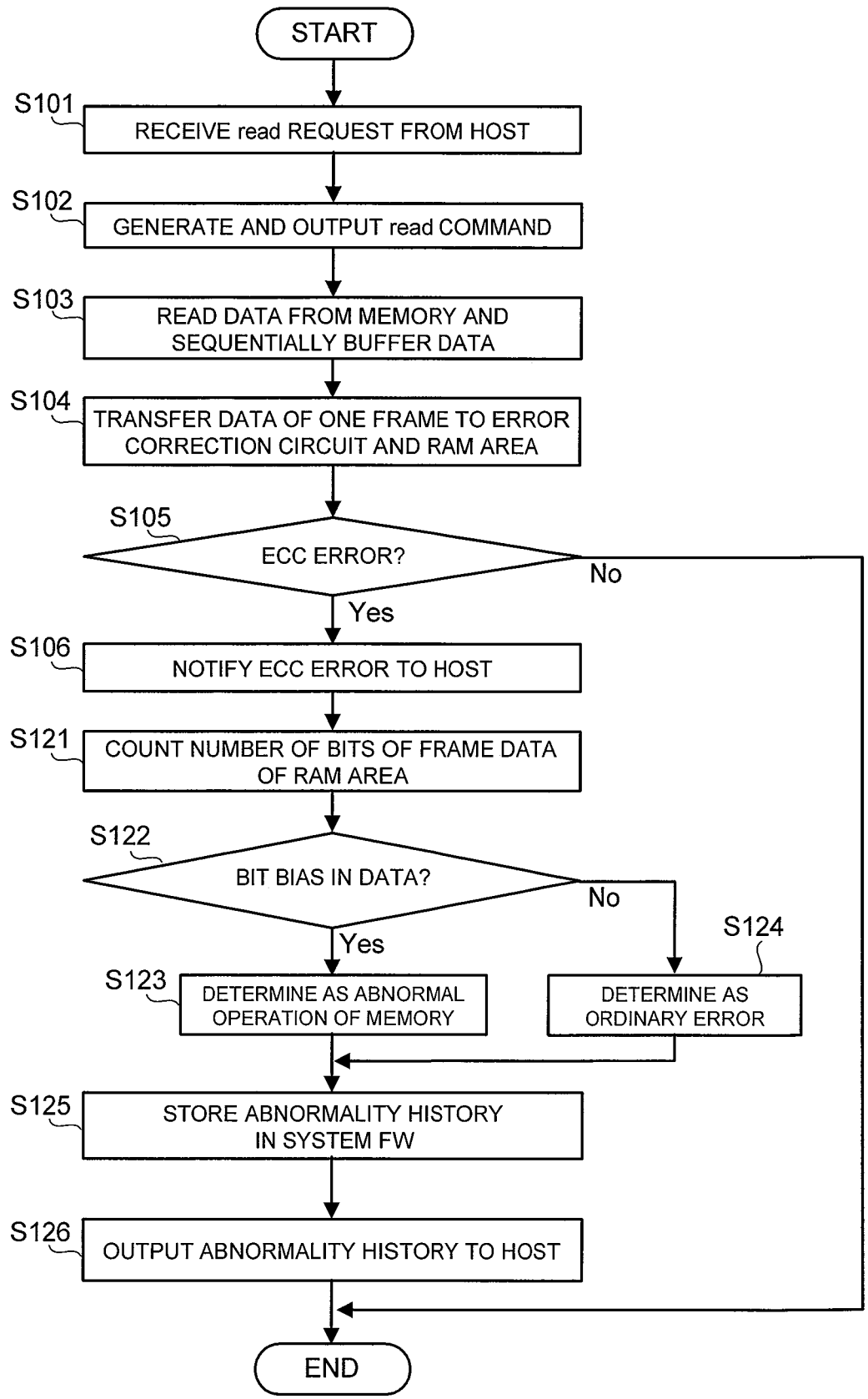
FIG. 6 is a flowchart illustrating an example of the operation of a memory system of the third embodiment.

Hereinafter, the operation of the memory system of the third embodiment will be described with reference to the flowchart in FIG. 6. In the description of the operation of the third embodiment, the same steps as those of the first embodiment and the second embodiment will be denoted by the same reference signs and a description thereof will be omitted.

In this memory system, when the SSD module 2 receives a read request from the host device 1, the CPU 28 issues a read command. As a result, data in the NAND memory 20 is buffered in sequence in the FIFO 23, and data of one frame is accumulated in the FIFO 23. The data is transferred to the error correction circuit 24 and the RAM area 27 (Steps S101 to S104 in FIG. 6).

Then, when the data decoding by the error correction circuit 24 results in the detection of an ECC error (Yes at Step S105), the CPU 28 notifies the host device 1 that the ECC error has been detected, as a read result (Step S106).

When the ECC error is detected by the error correction circuit 24, the bit count circuit 28a reads the frame data saved in the RAM area 27 from the RAM area 27, according to an instruction from the CPU 28, and performs the bit count of the frame data (Step S121). That is, the number of bits such as continuous "0's" and "1's" in the frame data is calculated.

The abnormality determination circuit 28b compares the result (the number of bits such as "0's" and "1's") counted by the bit count circuit 28a with the preset threshold value. When the counted result is equal to or more than the threshold value (when it satisfies the bit bias condition) and thus there is a bit bias (Yes at Step S122), the abnormality determination circuit 28b determines that there is a data abnormality due to an abnormal operation of the NAND memory 20 (Step S123). The abnormality determination circuit 28b stores (holds) the abnormality history which is the read data with the appended flag "1", in a memory area of the system FW (Step S125), thereby managing the abnormality history.

When the comparison of the counted result (the number of bits such as "0's" and "1's") and the threshold value turns out that there is no bit bias (No at Step S122), the abnormality determination circuit 28b determines that the error is an ordinary ECC error (Step S124). The abnormality determination circuit 28b thereafter stores (holds) the abnormality history which is the read data with the appended flag "0", in the memory area of the system FW (Step S125), thereby managing the abnormality history. In this example, the bit bias condition is "equal to or more than the threshold value" but may be "less than the threshold value".

When receiving an output request of the abnormality history of the frame data having the "ECC error" from the host device 1 (Yes at Step S111) after notifying the read result to the host device 1, the CPU 28 reads the abnormality history of the frame data whose output is requested, from the memory area of the system FW and outputs it to the host device 1 (Step S126).

The host device 1 is capable of quickly determining whether an abnormal operation is occurring in the NAND memory 20 or there is data degradation, from the abnormality history (flag "1" or "0" of this frame data) sent from the SSD module 2.

As described above, the memory system of the third embodiment brings about the same effect as that of the first embodiment by storing read data in the RAM area 27. The CPU 28 has the bit count circuit 28a and the abnormality determination circuit 28b, and the CPU 28 reads read data determined as having an ECC error from the RAM area 27 to perform the bit count and the abnormality determination. This enables to confirm the contents (the abnormality of the NAND memory 20 or the data degradation) of the ECC error quicker than analyzing the read data by the host device 1.

Fourth Embodiment

Figure 7:
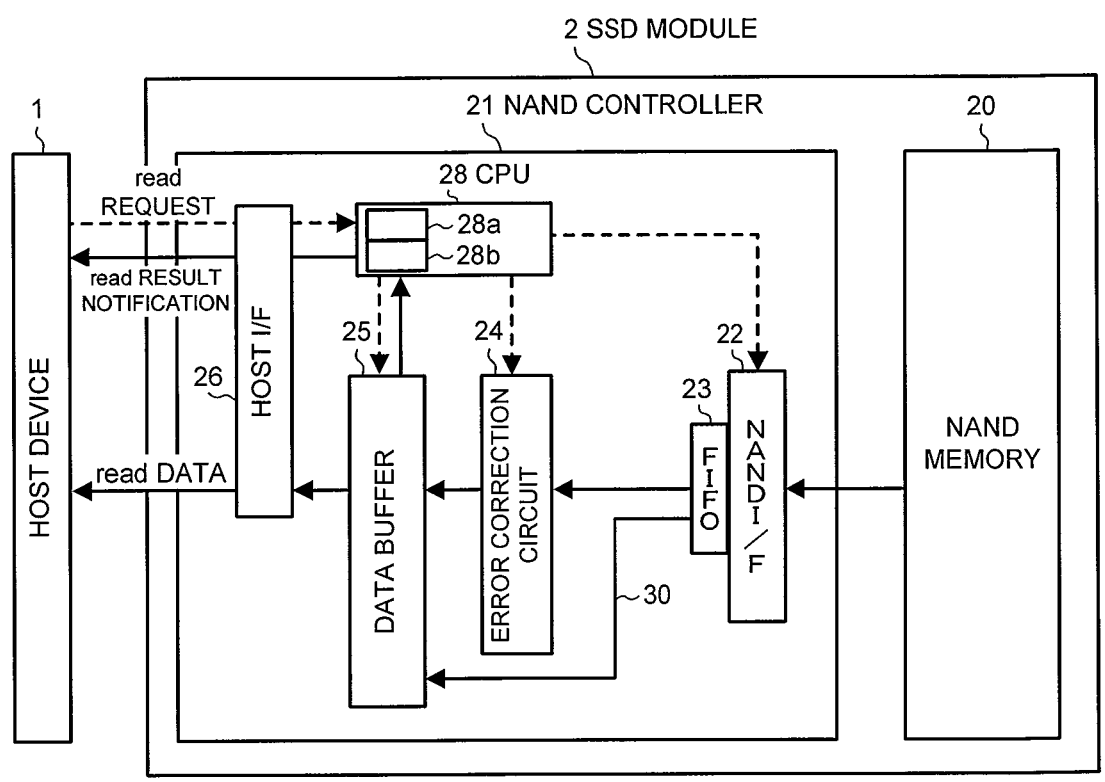
FIG. 7 is a diagram illustrating an example of the configuration of a memory system of a fourth embodiment.

FIG. 7 is a diagram illustrating the configuration of a memory system of a fourth embodiment.

As illustrated in FIG. 7, the memory system of the fourth embodiment does not have the RAM area 27 of the above-described first to third embodiments, but has a data line 30. The data line 30 is a different line from the data line from the FIFO 23 to the error correction circuit 24, and connects the FIFO 23 and the data buffer 25 not through the error correction circuit 24.

In the fourth embodiment, regarding data which is read from the NAND memory 20 and transferred on a predetermined processing unit size (one frame) basis from the FIFO 23, the error correction circuit 24 performs decoding while performing error detection. When an error is detected during the decoding, the error correction circuit 24 corrects the error of the data, and stores the error-corrected data in the data buffer 25 which is intended to output it to the host device 1 (external device).

On the other hand, when an uncorrectable error (ECC error) is detected in the data during the decoding, the data is discarded. Then, the CPU 28 issues a new read command for the same data. According to the read command, the data is re-read from the NAND memory 20. This data is not transferred to the error correction circuit 24 but is stored (held) in the data buffer 25 through the data line 30.

More specifically, the read data which is read from the NAND memory 20 in response to the read request from the host device 1 is transferred to the error correction circuit 24. When the decoding of the read data by the error correction circuit 24 results in the detection of an ECC error in the read data, the CPU 28 notifies it to the host device 1 and thereafter issues a re-read command to an address where the ECC error has occurred.

The CPU 28 issues the read command and executes read processing from the NAND memory 20. The CPU 28 causes the read data which is read to the FIFO 23 by this processing to be stored in the data buffer 25 through the data line 30.

Thereafter, the CPU 28 reads the read data which is re-read, from the data buffer 25 and performs processing involved in the analysis as in the third embodiment. That is, the bit count circuit 28a performs the bit count of the read data which is re-read, and the abnormality determination circuit 28b performs the abnormality determination to store the determination result (abnormality history) in a memory area of the system FW.

Hereinafter, the operation of the memory system of the fourth embodiment will be described with reference to the flowchart in FIG. 8. In the description of the operation of the fourth embodiment, the same steps as those of the first to third embodiments will be denoted by the same reference signs and a description thereof will be omitted.

In this memory system, when the SSD module 2 receives a read request from the host device 1, the CPU 28 issues a read command. As a result, data in the NAND memory 20 is buffered in sequence in the FIFO 23. When data of one frame is accumulated in the FIFO 23, the data is transferred to the error correction circuit 24 (Steps S101 to S104 in FIG. 8).

Then, when the data decoding by the error correction circuit 24 results in the detection of an ECC error (Yes at Step S105), the CPU 28 notifies the host device 1 that the ECC error has been detected, as a read result (Step S106).

When the ECC error is detected by the error correction circuit 24, the CPU 28 issues a re-read command to an address where the ECC error has occurred and executes the read from the NAND memory 20 (Step S131). The data is read to the FIFO 23 and is stored in the data buffer 25 through the data line 30 (Step S132).

Subsequently, in the CPU 28, the bit count circuit 28a reads, from the data buffer 25, the frame data which is re-read and saved in the data buffer 25. The CPU 28 performs the bit count of the read frame data (Step S133) and counts the number of bits such as "0's" and "1's". Subsequent processing is the same as that (Steps S122 to S126) of the third embodiment.

The host device 1 is capable of quickly determining whether an abnormal operation is occurring in the NAND memory 20 or there is data degradation, from the abnormality history (flag "1" or "0" of the frame data) sent from the SSD module 2.

As described above, according to the memory system of the fourth embodiment, by storing the read data in the data buffer 25, it is possible to obtain the same effect as that of the above-described first embodiment. This eliminates a need for providing the specialized RAM area 27 which is described in the first to third embodiments and facilitates the application of this embodiment to an existing system.

Further, the CPU 28 has the bit count circuit 28a and the abnormality determination circuit 28b. After read data determined as having an ECC error is re-read from the NAND memory 20 to be stored in the data buffer 25, the bit count and the abnormality determination are performed on this read data. This makes it possible to detect the contents (the abnormality of the NAND memory 20 or the data degradation) of the ECC error quicker than analyzing the read data by the host device 1.

As described above, according to the above-described first to fourth embodiments, it is possible to detect and identify an output abnormality of data read from the NAND memory 20 at an early stage, enabling a reduction in analysis cost.

While certain embodiment s have been described, these embodiments have been presented by way of example only, and are not intended to limit the scope of the inventions. Indeed, the novel embodiments described herein may be embodied in a variety of other forms: furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory apparatus, comprising:
   a nonvolatile semiconductor memory device;
   an error correction circuit configured to
      perform error detection in first data on a processing unit size basis, and
      perform error correction on the first data in response to its necessity;
   a memory circuit configured to store second data on the processing unit size basis;
   a data distribution circuit configured to:
      transfer third data read from the nonvolatile semiconductor memory device to the error correction circuit as the first data and
      transfer the third data to the memory circuit as the second data on the processing unit size basis; and
   a processing circuit configured to read the second data from the memory circuit and process the second data in response to the error correction circuit detecting an uncorrectable error in the first data.

2. The apparatus according to claim 1, wherein the processing circuit reads the second data from the memory circuit and outputs the second data to an external device.

3. The apparatus according to claim 1, wherein the processing circuit reads the second data from the memory circuit and stores the second data in the nonvolatile semiconductor memory device.

4. The apparatus according to claim 2, wherein the processing circuit reads the second data from the memory circuit and outputs the second data to the external device, in response to a request from the external device.

5. The apparatus according to claim 3, wherein the processing circuit reads the second data from the nonvolatile semiconductor memory device and outputs the second data to the external device, in response to a request from the external device.

6. The apparatus according to claim 1, wherein the processing circuit includes:
   a count circuit configured to count the number of "0" or "1" in the second data; and
   a determination circuit configured to:
      determine the nonvolatile semiconductor memory device having an operation abnormality in response to the number counted by the count circuit or/and a bit array of the second data satisfying a bias condition, and
      determine data degradation at a time of read in response to the number or/and the bit array not satisfying the bias condition.

7. The apparatus according to claim 6, wherein the determination circuit generates abnormality history information indicating determined result.

8. The apparatus according to claim 7, wherein the abnormality history information is output to an external device in response to a request from the external device.

9. A memory apparatus comprising:
   a nonvolatile semiconductor memory device;
   an error correction circuit configured to:
      perform error detection in first data read from the nonvolatile semiconductor memory device on a processing unit size basis,
      perform error correction on the first data in response to its necessity, and
      store the error-corrected first data in a data buffer as second data for outputting to an external device;
   a data distribution circuit configured to:
      store third data read from the nonvolatile semiconductor memory device into the data buffer without error correction when the error correction circuit detects an uncorrectable error in the first data; and
   a processing circuit configured to read the third data stored in the data buffer and process the third data.

10. A data read method comprising:
    reading first data from a nonvolatile semiconductor memory device;
    transferring the first data to an error correction circuit as second data and transferring the first data to a memory circuit as third data on a processing unit size basis;
    performing error detection in the second data transferred to the error correction circuit and performing error correction on the second data in response to its necessity; and reading the third data stored in the memory circuit and processing the third data in response to detection of an uncorrectable error in the second data.

11. The method according to claim 10, further comprising:
   storing the third data in the nonvolatile semiconductor memory device in response to detection of an uncorrectable error in the second data; and
   reading the third data stored in the memory circuit and processing the third data in response to a request from an external device.

* * * * *